(12) United States Patent
Williams

(10) Patent No.: US 6,838,319 B1
(45) Date of Patent: Jan. 4, 2005

(54) TRANSFER MOLDING AND UNDERFILLING METHOD AND APPARATUS INCLUDING ORIENTING THE ACTIVE SURFACE OF A SEMICONDUCTOR SUBSTRATE SUBSTANTIALLY VERTICALLY

(75) Inventor: Vernon M. Williams, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 99 days.

(21) Appl. No.: 09/652,503

(22) Filed: Aug. 31, 2000

(51) Int. Cl.[7] .................... H01L 21/44; H01L 21/48; H01L 21/50
(52) U.S. Cl. .................... 438/124; 438/126; 438/973
(58) Field of Search .................... 438/124, 126, 438/973, 47, 26, 106, 108, 110, 112, 118; 257/667, 704, 737, 778, 787; 29/841; 361/704

(56) References Cited

U.S. PATENT DOCUMENTS

| | | | |
|---|---|---|---|
| 4,305,897 A | 12/1981 | Hazama et al. | 264/23 |
| 4,554,126 A | 11/1985 | Sera | 264/272 |
| 4,779,835 A | 10/1988 | Fukushima et al. | 249/161 |
| 4,818,204 A | 4/1989 | Nakagawa et al. | 249/83 |
| 4,900,485 A | 2/1990 | Murakami | 264/40.1 |
| 4,908,178 A | 3/1990 | Nakagawa et al. | 264/272.17 |
| 5,071,334 A | 12/1991 | Obara | 425/116 |
| 5,074,779 A | 12/1991 | Tsutsumi et al. | 425/444 |
| 5,293,072 A | 3/1994 | Tsuji et al. | 257/737 |
| 5,471,369 A * | 11/1995 | Honda et al. | 361/813 |
| 5,626,887 A | 5/1997 | Chou et al. | 425/129.1 |
| 5,766,982 A | 6/1998 | Akram et al. | 438/51 |
| 5,841,192 A | 11/1998 | Exposito | 257/781 |
| 5,914,531 A | 6/1999 | Tsunoda et al. | 257/668 |
| 5,981,312 A | 11/1999 | Farquhar et al. | 438/112 |
| 5,998,243 A | 12/1999 | Odashima et al. | 438/127 |
| 6,001,672 A | 12/1999 | Wensel | 438/124 |
| 6,081,997 A * | 7/2000 | Chia et al. | 29/841 |
| 6,159,770 A * | 12/2000 | Tetaka et al. | 438/112 |
| 6,187,612 B1 | 2/2001 | Orcutt | 438/186 |
| 6,309,916 B1 | 10/2001 | Crowley et al. | 438/127 |
| 6,365,976 B1 | 4/2002 | Carter | 257/779 |
| 6,573,121 B2 * | 6/2003 | Yoneda et al. | 438/106 |

FOREIGN PATENT DOCUMENTS

| | | | | |
|---|---|---|---|---|
| JP | 55091838 A | * | 9/1980 | ........... H01L/21/60 |
| JP | 6-151492 | * | 5/1994 | |
| JP | 09162210 A | | 6/1997 | |
| JP | 11097470 A | | 4/1999 | |

* cited by examiner

Primary Examiner—William M. Brewster
(74) Attorney, Agent, or Firm—TraskBritt

(57) ABSTRACT

A method and apparatus for reducing or eliminating the formation of air pockets or voids in a flowable material provided in contact with at least one substrate. The flowable material is provided in a non-horizontal direction and flows from a lower portion to an upper portion. As a result, the flowable material is provided uniformly with a single, uniform flow front due to gravity acting thereon and gravity thereby substantially preventing voids and air pockets from forming in the flowable material. In one embodiment, the at least one substrate is provided in the cavity of a transfer mold in which the cavity is filled from a gate at a lower portion of the cavity to a vent at an upper portion of the cavity. In another embodiment, a bumped semiconductor device is attached to a substrate having a gap therebetween, in which the gap is oriented longitudinally perpendicular to a horizontal plane so that the flowable material may fill the gap in a vertical direction.

41 Claims, 7 Drawing Sheets

TRANSFER MOLDING AND UNDERFILLING METHOD AND APPARATUS INCLUDING ORIENTING THE ACTIVE SURFACE OF A SEMICONDUCTOR SUBSTRATE SUBSTANTIALLY VERTICALLY

BACKGROUND OF THE INVENTION

1. Field of the Invention

The present invention relates to a method and apparatus used in transfer molding to provide a flowable resin to a substrate having one or more semiconductor devices thereon for the packaging thereof. More specifically, the present invention relates to a method and apparatus used in transfer molding to prevent voids and air pockets in a flowable resin provided to a substrate having one or more semiconductor devices thereon for the packaging thereof.

2. State of the Art

At present, transfer molding is a widely adopted method for plastic encapsulation of semiconductor devices. In transfer molding, the mold generally includes a lower half and an upper half. The lower half of the mold will typically include multiple cavities and a concave portion, called a pot, which communicates with the multiple cavities through runners. In one instance of molding a package, a lead frame at the outer periphery of a semiconductor device is placed on an edge of each of the cavities. The upper half of the mold is placed on the lower half of the mold and includes cavities and a through hole corresponding to the cavities and the pot of the lower half of the mold, respectively. The cavity of either the upper half or lower half, or both, includes a vent, usually at the opposite end of the cavity from the runner, to allow air to push therethrough. An assembly of a semiconductor device and a lead frame connected thereto is arranged in each space defined between corresponding cavities of the lower half and upper half of the mold, where each of the cavities are oriented longitudinally along the horizontal plane. A thermosetting resin is heated in the pot and fed therefrom by a plunger. The resin reaches the cavities through the runners and covers the semiconductor device and a portion of the lead frame located in each of the cavities, pushing air from the runners and cavities through the vent. The resin is typically then heated to cure the same, thus encapsulating the semiconductor device and adjacent portion of the lead frame.

However, as shown in drawing FIG. 1, when the resin or underfill material 1 flows to fill the horizontally oriented cavities 3, the flow is usually not uniform due to various design factors of the semiconductor device 32 and lead frame 33 and gravity acting on the resin 1. As a result, the fronts 1a, 1b of the resin 1 flowing above and below the semiconductor device 32 will often meet above the semiconductor device 32 instead of at the vent, causing the molded package to have undesirable air pockets and/or voids 2, as shown in drawing FIG. 2. These types of defects not only degrade the outer appearance of the molded package, but also produce reliability problems with respect to its resistance to thermal shock and exposure to humidity and other contaminants.

In an effort to prevent such defects in the molded package, U.S. Pat. No. 4,900,485 to Murakami discloses a method and apparatus for transfer molding semiconductor devices including a hydraulic pressure controller and a pressure detector to control the pressure of the resin therein. Additionally, other methods made to prevent defects such as voids by controlling the temperature of the resin are disclosed in U.S. Pat. No. 4,908,178 to Nakagawa et al. and U.S. Pat. No. 5,071,334 to Obara. Although each of the above references disclose a method and/or apparatus for limiting air pockets and/or voids in a molded package, each reference discloses a transfer mold that is longitudinally oriented to be horizontal. Thus, as previously discussed, there remains the problem of non-uniform flow fronts in the transfer mold, resulting in air pockets and/or voids.

Along with the previously discussed problems in transfer molding, methods in flip-chip packaging are known to present similar problems of voids and/or air pockets in underfill material 1 in a gap between a bumped semiconductor die and a substrate. As shown in drawing FIG. 3, such methods include a one-sided or two-sided dispense process, where an underfill material, such as resin 1, is dispensed along one or two adjacent sides of the semiconductor die 52. The underfill resin 1 then freely flows by capillary action between the semiconductor die 52 and substrate 64, pushing air existing in the gap between the die 52 and the substrate 64 from opposing sides of the semiconductor die 52 as the underfill material 1 fills the gap, thereby minimizing potential voids. However, as shown in drawing FIG. 3, the underfill resin 1 will often leave air pockets or voids 2 adjacent the bumps 56 of the flip-chip semiconductor die 52. Further, it is desirable to improve the time it takes to fill the gap with the underfill material.

U.S. Pat. No. 5,766,982 to Akram et al. addresses improving the time for underfilling a flip-chip package by elevating the package on an inclined plane from a horizontal plane. In this method, the underfill material is dispensed either through an aperture in the substrate or at one or two elevated sides of the gap between the die and substrate. When dispensing the underfill material by these methods, the underfill material filling the gap flows down the inclined plane, thereby utilizing gravity to decrease the time necessary for underfilling. Although this method improves the time for underfilling, there remains the potential for voids and air pockets to form due to non-uniform flow and, in particular, voids forming adjacent the bumps of the flip-chip package.

Therefore, it would be advantageous to obtain substantially uniform flow of a packaging or underfill resin to reduce or eliminate the occurrence of voids in the resin, as well as to provide molds and systems that facilitate uniform resin flow during packaging or underfill operations.

SUMMARY OF THE INVENTION

The present invention relates to a method and apparatus for limiting voids in a flowable packaging material provided to a substrate, such as a semiconductor die or a wafer or other large-scale substrate including a plurality of semiconductor devices fabricated thereon. The present invention is directed to a method and apparatus for providing the flowable material to the substrate in a substantially vertical direction with respect to a horizontal plane. The method of the present invention includes orienting the substrate substantially vertically.

In one embodiment, the present invention includes a transfer mold having at least one cavity with a gate at a lower portion of the cavity and a vent at an upper portion of the cavity, in which the cavity may be oriented longitudinally perpendicular to the horizontal plane and configured to vertically orient the substrate. According to this embodiment of the present invention, the flowable material fills the cavity from the gate at the bottom thereof to the vent at the top thereof to encapsulate the substrate and/or provide a layer of the flowable material over at least a portion of the substrate. By this arrangement, voids and air pockets are substantially prevented from forming in the flowable material since the flowable packaging material fills the cavity in the vertical direction and due to the force of gravity acting on the flowable material.

In another embodiment, the present invention includes a semiconductor device attached to a substrate having bumps therebetween, in which the bumps provide a gap between the semiconductor device and the substrate. According to this embodiment of the present invention, the semiconductor device and substrate are oriented substantially vertically so that the gap may be filled with flowable underfill material in a vertical direction. This embodiment may include a barrier positioned about the periphery of the semiconductor device for containing the flowable material in the gap between the semiconductor device and the substrate. The barrier includes an opening where the flowable material is introduced into the gap. The flowable material fills the gap from the bottom thereof and is drawn upwardly therethrough by way of capillary action or under positive or negative pressure.

BRIEF DESCRIPTION OF THE SEVERAL VIEWS OF THE DRAWINGS

The method and apparatus of the present invention will be more fully understood from the detailed description of the invention taken in conjunction with the drawings, wherein.

DETAILED DESCRIPTION OF THE INVENTION

Embodiments of the present invention will be hereinafter described with reference to the accompanying drawings. It should be understood that the illustrations are not meant to be actual views of any particular apparatus and/or method, but are merely idealized representations which are employed to more clearly and fully depict the present invention than would otherwise be possible. Additionally, elements common between the figures retain the same numerical designation.

Figure 4:
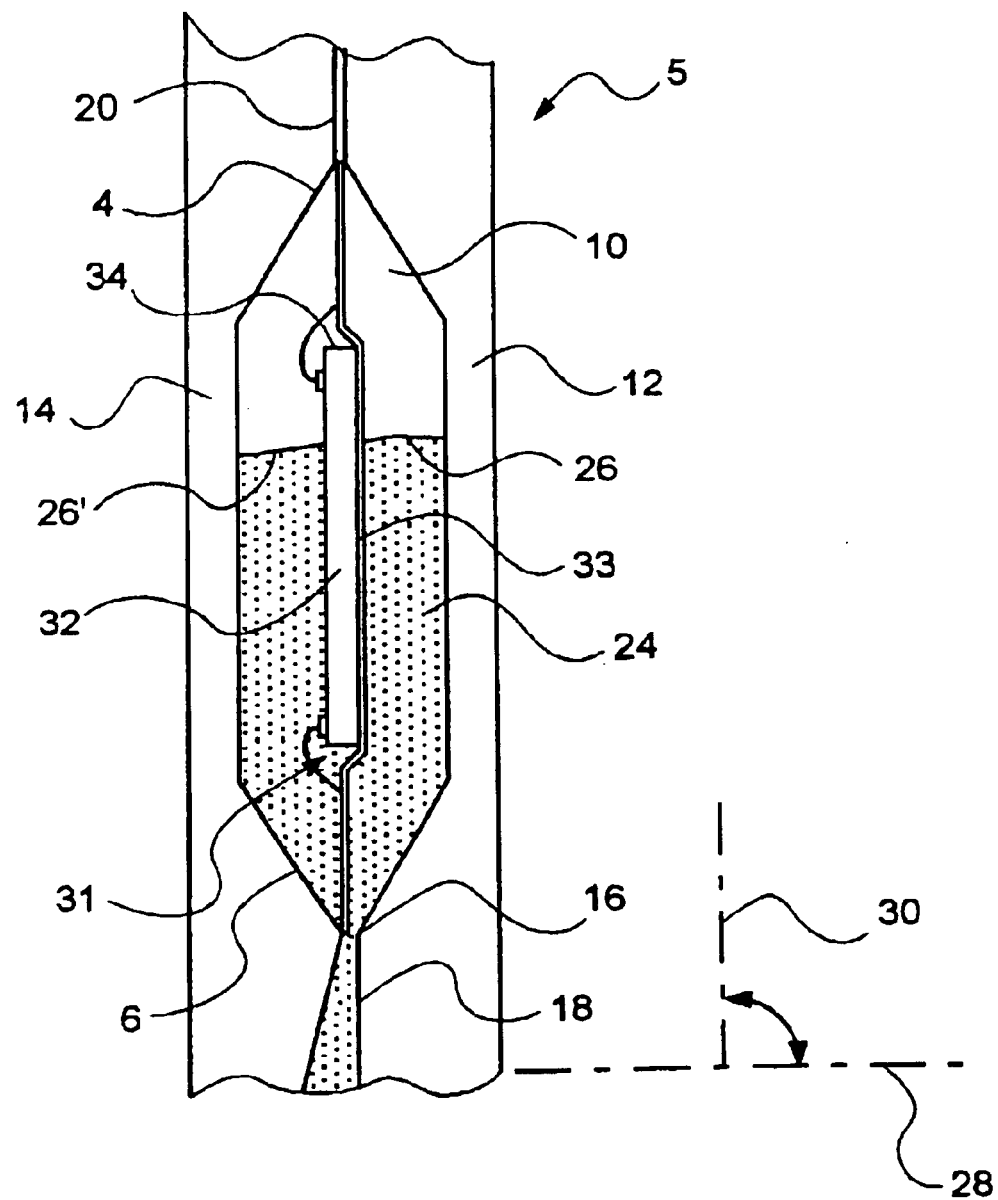
FIG. 4 is a cross-sectional side view of a semiconductor device in a vertically oriented mold cavity, illustrating resin encapsulating the semiconductor device so that the resin fills the cavity in a substantially vertical upward direction, in accordance with the present invention.

A first embodiment of the present invention is illustrated in drawing FIG. 4, depicting a transfer mold 5 for encapsulating an assembly 31 of a semiconductor device 32 and an adjacent portion of a lead frame 33 connected thereto by utilizing a transfer molding process. The term "transfer" molding is descriptive of this process as the molding compound, in a liquid state, is transferred by capillary action or under pressure to a plurality of remotely-located mold cavities 10 containing semiconductor device assemblies 31 to be encapsulated.

The transfer mold 5 includes a first half 12 and a second half 14 which form a plurality of cavities 10 therebetween. However, for purposes of simplicity, only one cavity 10 is illustrated in drawing FIG. 4. The cavity 10 includes a gate 16 and a vent 20. The gate 16 is used as an inlet for resin 24 to flow into the cavity 10. The vent 20, located at an opposite end of the cavity 10 from the gate 16, permits air or other gases in the cavity 10 to escape therefrom upon introduction of resin 24 into the cavity 10.

As known to those skilled in the art of transfer molding, a pellet preferably containing liquid thermoset resin mold compound, which is also referred to herein as resin 24 for simplicity, is disposed above a plunger in a pot (not shown). The plunger engages and melts the pellet, forcing the liquid resin 24 that was contained therein through a sprue to runners which each lead to the plurality of cavities. As shown in drawing FIG. 4, each runner 18 leads to the gate 16 of a cavity 10, allowing the resin 24 to fill the cavity 10 and encapsulate the semiconductor device 32 and the adjacent portions of lead frame 33 therein.

In the present invention, the vent 20 is located substantially at an upper portion 4 of the cavity 10 with the gate 16 preferably located at a lower portion 6 of the cavity 10. In particular, as shown in drawing FIG. 4, it is preferable that the mold cavity 10 be oriented substantially vertical and longitudinal along a vertical plane 30 which is substantially perpendicular or at substantially 90° from a horizontal plane 28. As such, when the resin 24 fills the cavity 10, the flow fronts 26 and 26' rise vertically toward the vent 20 at substantially the upper portion 4 of the cavity 10. Further, the flow fronts 26 and 26' rise substantially at the same rate due to the force of gravity acting on the flow fronts 26 and 26'. Therefore, gravity helps control the flow fronts 26 and 26' to equalize and become substantially one flow front prior to reaching the vent 20 at the uppermost portion 4 in the cavity 10, allowing the resin 24 to substantially fill all portions of the cavity 10 and forcing air or gases within the cavity 10 through the vent 20 without substantially creating air pockets and/or voids in resin 24. Even if the flow fronts 26 and 26' rise at different rates prior to surpassing an edge 34 of the semiconductor device 32, the flow fronts 26 and 26' will substantially equalize each other after reaching the uppermost edge 34 of the semiconductor device 32 due to the force of gravity acting thereon. In this manner, gravity provides a more uniform flow front, wherein gravitational force induces the filling of spaces where potential air pockets and/or voids were conventionally formed in the cavity 10. Therefore, the present invention substantially prevents the conventional problems of voids and air pockets as previously discussed. In the present invention, the fluid molding material is caused to flow over any desired substrate having any type and number of semiconductor devices attached thereto in a substantially vertical direction, such as a substrate and semiconductor device(s) being located in the mold cavity at approximately ninety degrees (90°) with respect to the horizontal axis of the mold cavity.

According to the first embodiment of the present invention, the semiconductor device is preferably a lead frame packaging assembly utilizing wire bonding, tape automated bonding (TAB), and/or any known bonding technique from the semiconductor device to leads of the lead frame as known in the art. However, the present invention is not limited to lead frame packaging assemblies, but may also encompass transfer molding of semiconductor assemblies including semiconductor devices secured to other carriers, such as carrier substrates or interposers, by way of wire bonds, tape automated bonds (TAB), flip-chip bonds, or other known techniques. Alternatively, the methods and apparatus of the present invention may be used to package or form protective layers on individual semiconductor device components (e.g., semiconductor dice, interposers, carrier substrates, other carriers, etc.). In addition, the semiconductor device in the present invention is preferably vertically oriented, substantially perpendicular to the horizontal plane 28. However, the semiconductor device 32 may be oriented at any inclined angle from the horizontal plane 28, so long as the force of gravity creates a uniform flow front that will permit substantially all of the air or other gases within the cavity 10 to escape therefrom so as to reduce or eliminate the formation of voids or air pockets in resin 24.

Figure 5:
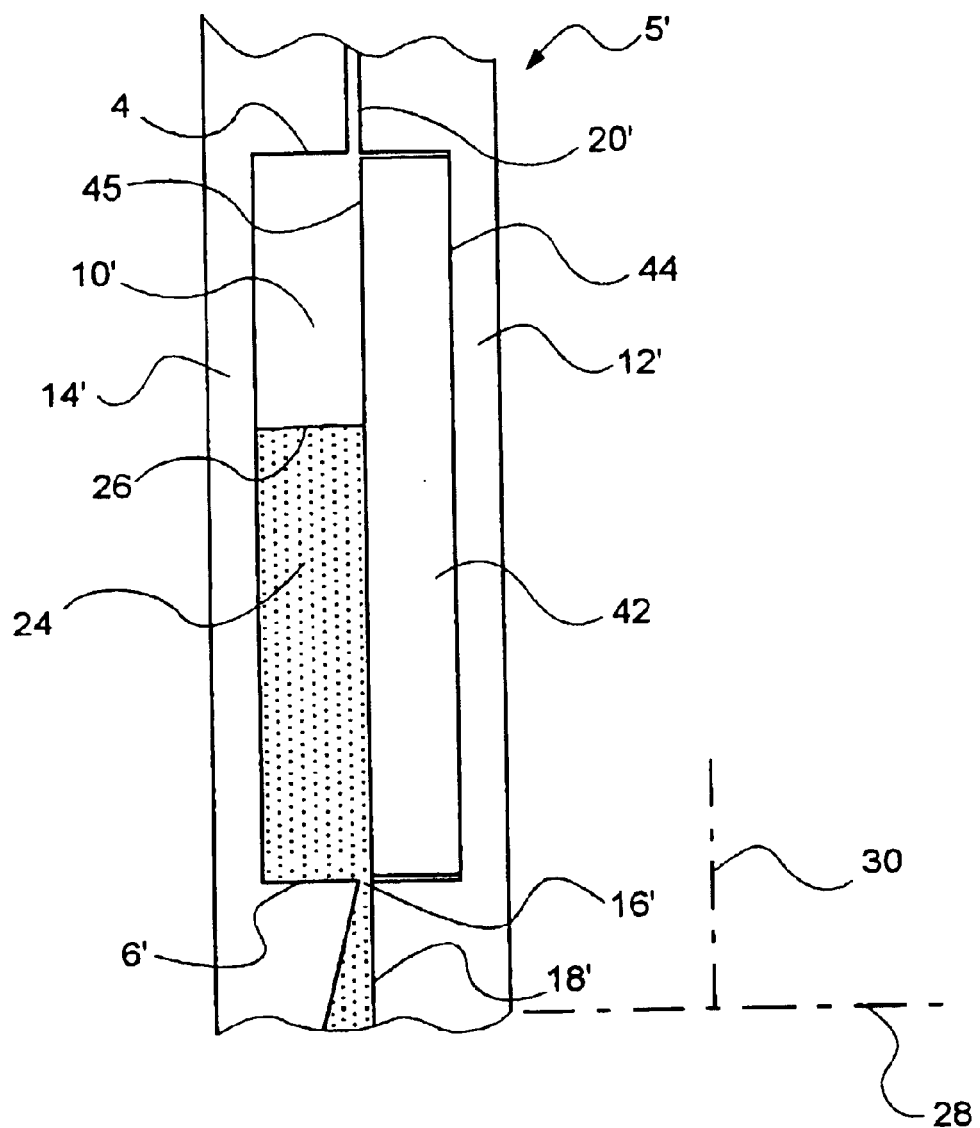
FIG. 5 is a cross-sectional side view of a substrate in a vertically oriented mold cavity, illustrating resin flowing in the vertically oriented mold cavity in a substantially vertical upward direction, in accordance with the present invention.

A second embodiment of the present invention is illustrated in drawing FIG. 5, depicting resin 24 filling a transfer mold 5' in a substantially vertical direction similar to that of the first embodiment. However, instead of a semiconductor device being encapsulated as in the first embodiment, the second embodiment comprises a first surface 44, or back side, of a substrate 42, such as an individual semiconductor die or a wafer or other large-scale substrate with a plurality of semiconductor devices thereon, abutting a first half 12' of the cavity 10', which is configured to retain substrate 42. Further, there may be multiple substrates 42 within a single cavity 10'. The other, active, surface 45 of the substrate 42 is exposed to the remainder of the cavity 10'. As the resin 24 vertically rises in the cavity 10', the resin 24 covers at least surface 45 of the substrate 42 and may cover other surfaces of the substrate, depending on how the substrate 42 is situated within the cavity 10'. The substrate 42 is preferably substantially vertically oriented relative to a horizontal plane 28. However, the plane of the substrate 42 may be oriented at any inclined angle from the horizontal plane 28, so long as the vent 20' in the cavity 10' is substantially at the upper portion 4 of the cavity 10' and the force of gravity acting on the resin 24 will continue to force substantially all air or other gases out of the cavity through the vent 20' before any air pockets or other voids form. Following such encapsulation, bond pads on surface 45 may be exposed through the cured resin 24 by known techniques, such as mask and etch processes.

Figure 6:
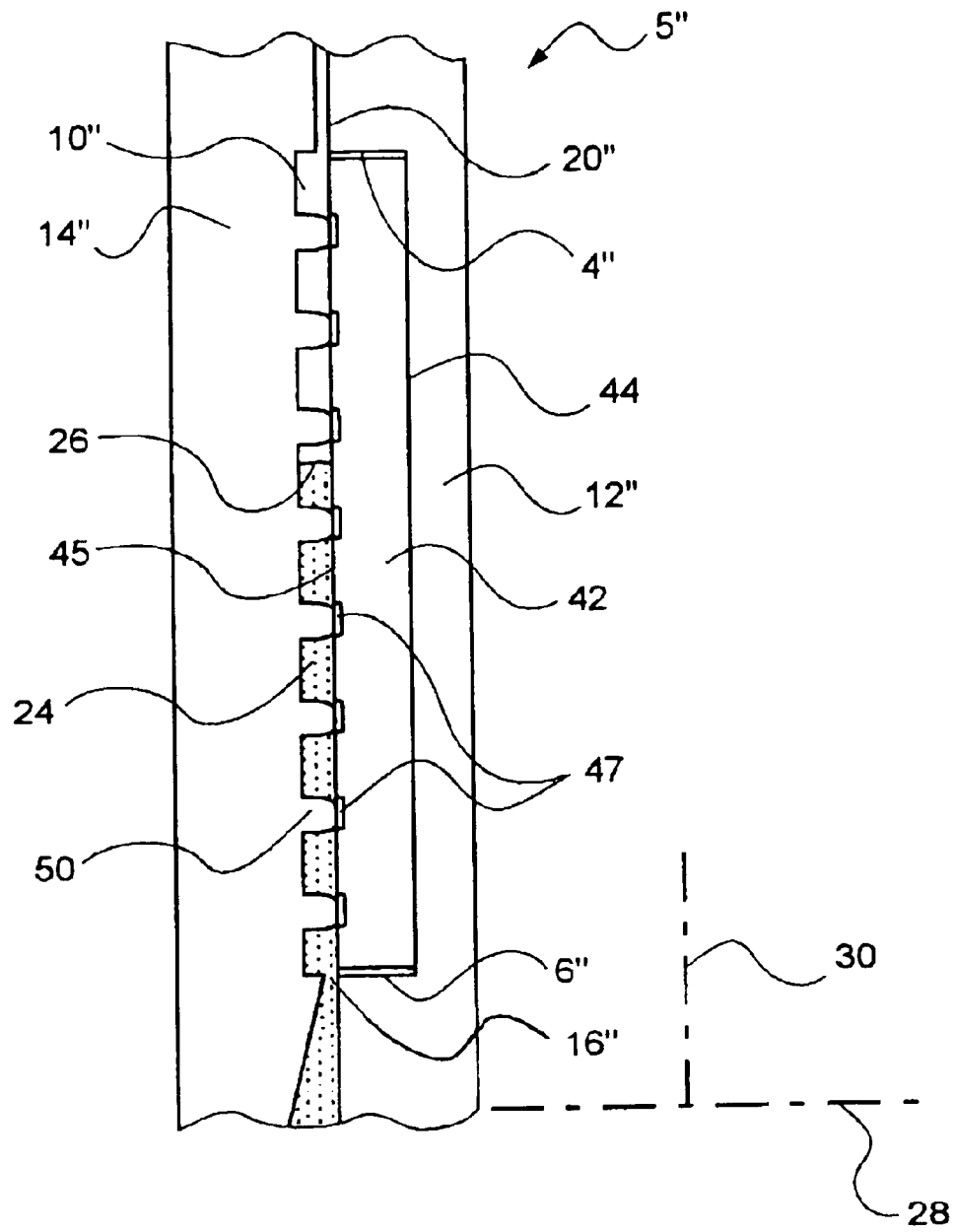
FIG. 6 is a cross-sectional side view of a substrate in a vertically oriented mold cavity, wherein the cavity includes protrusions configured to contact bond pads or contacts of the substrate, and illustrating resin flowing into the vertically oriented mold cavity in a substantially vertical upward direction, in accordance with the present invention.

A third embodiment of the present invention is illustrated in drawing FIG. 6, depicting resin 24 filling a transfer mold 5" in a substantially vertical direction to cover at least a portion of the surface 45 of the substrate 42. The third embodiment is similar to the second embodiment in all respects, except the second half 14" of the transfer mold 5" includes a plurality of projections 50 configured to extend to the surface 45 of the substrate 42 and contact bond pads 47 thereon. The projections 50 extending from the second half 14" of the transfer mold 5" allow resin 24 to rise vertically around the projections 50. Thus, bond pads 47 on the surface 45 of the substrate 42 that are contacted by projections 50 are shielded from resin 24 and are free of resin 24. Therefore, the resin-free bond pads 47 of the substrate 42 can receive solder balls or the like without further significant modification of the layer of resin 24 on surface 45. Moreover, the openings formed in resin 24 may define the configurations of at least the lower portions of solder bumps or other conductive structures formed on bond pads 47.

Figure 7:
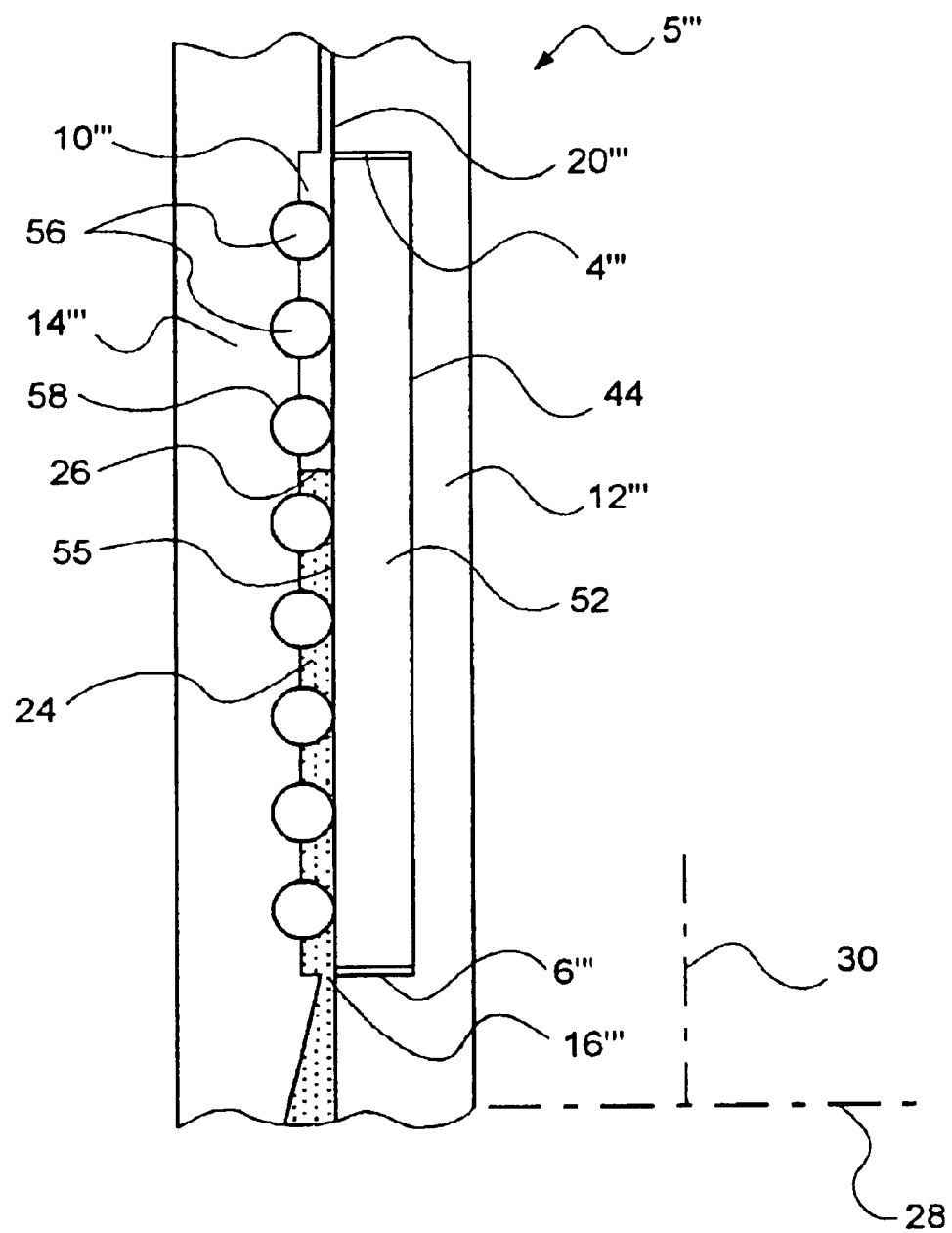
FIG. 7 is a cross-sectional side view of a ball grid array substrate positioned in a vertically oriented mold cavity, illustrating resin flowing upwardly into the vertically oriented mold cavity, in accordance with the present invention.

A fourth embodiment of the present invention is illustrated in drawing FIG. 7, depicting resin 24 filling the cavity 10'" of a transfer mold 5'" in a substantially vertical direction to cover at least the surface 45 of the substrate, in this case a flip-chip type semiconductor die 52. Of course, the cavity 10'" may alternatively be configured to hold and facilitate encapsulation of an individual semiconductor die 52, a plurality of individual dice, or a wafer or other large-scale substrate with a plurality of semiconductor devices thereon. The fourth embodiment is similar to the second embodiment in all respects, except the semiconductor die 52 includes conductive structures 56, such as balls, bumps, pillars, or columns including a conductive material such as a solder, other metal or metal alloy, a conductive epoxy, a conductor-filled epoxy, or a z-axis conductive elastomer, predisposed on and protruding from the bond pads thereof. Additionally, the second half 14'" of the transfer mold 5'" may include a plurality of imperforate recesses 58 formed in and configured to substantially conformally receive at least portions of conductive bumps 56 so as to prevent resin 24 from completely covering the same.

Figure 8:
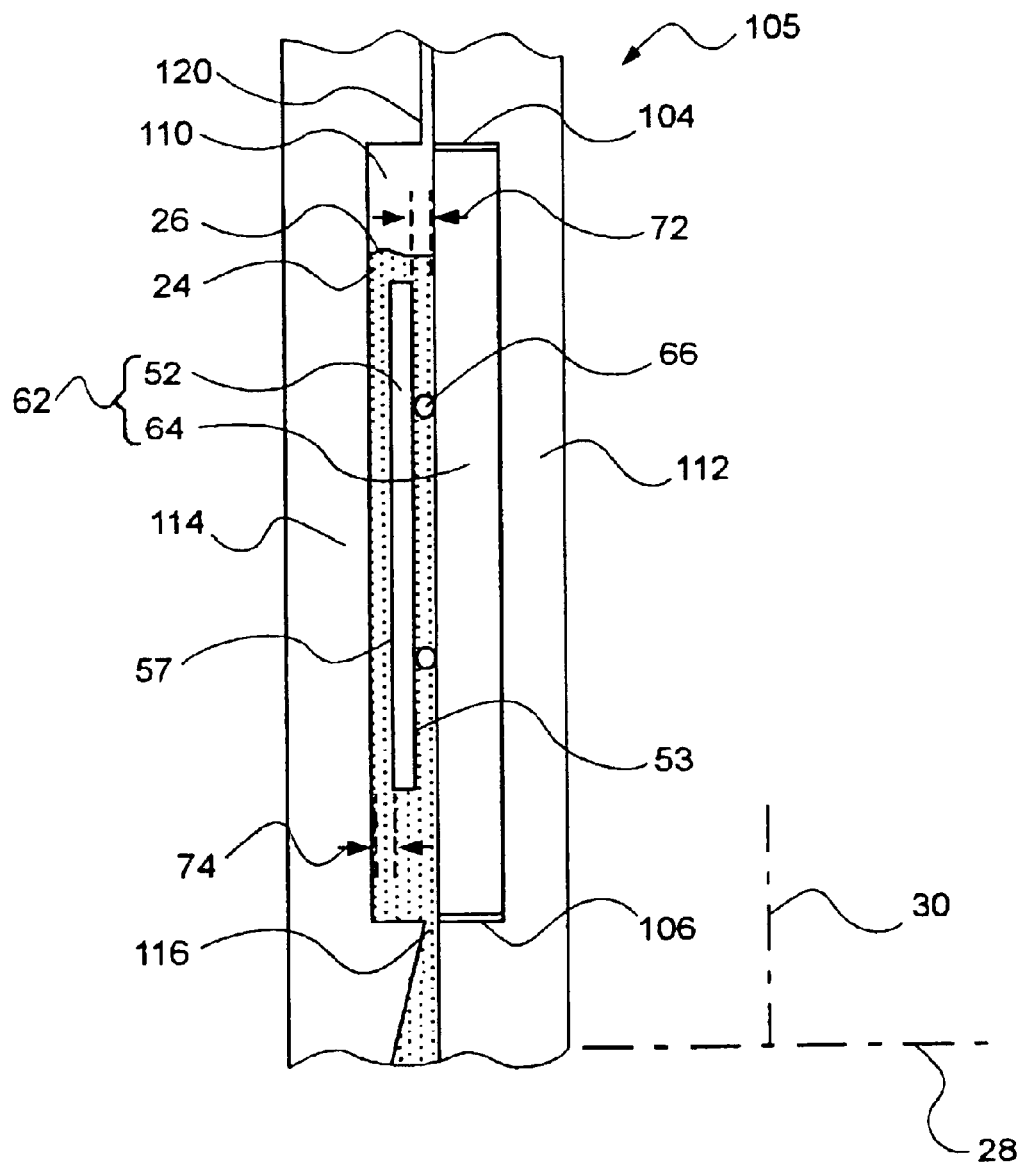
FIG. 8 is a cross-sectional side view of an assembly, including a carrier substrate and a semiconductor device flip-chip bonded thereto, in a vertically oriented mold cavity, illustrating resin flowing in the vertically oriented mold cavity in a substantially vertical upward direction, in accordance with the present invention.

A fifth embodiment of the present invention is illustrated in drawing FIG. 8, depicting resin 24 filling a transfer mold 105 in a substantially vertical direction. The fifth embodiment is similar to the second embodiment in all respects, except the cavity 110 is configured to receive and at least partially encapsulate a flip-chip assembly 62. The flip-chip assembly 62 includes a carrier, such as a carrier substrate 64 or an interposer, and a flip-chip type semiconductor die 52 with conductive structures 66. As such, the conductive structures 66 connected to carrier substrate 64 provide electrical connection and a gap 72 between an active surface 53 of the semiconductor die 52 (i.e., the surface facing substrate 64) and the substrate 64. In the fifth embodiment, there may also be a space 74 between the surface of the second half 114 of the transfer mold 105 and back side 57 of the semiconductor die 52. Alternatively, the back side 57 of the semiconductor die 52 may abut with the inside surface of the second half 114 of the transfer mold 105. Furthermore, in the fifth embodiment of the present invention, the resin 24 has a viscosity that allows optimal underfilling of the gap 72, as known in the art Thus, it can be well appreciated that by controlling the viscosity of the resin 24, underfilling may be accomplished efficiently while also preventing air pockets and/or voids in the gap 72, in accordance with the present invention.

In addition, as in the previous embodiments, the flip-chip assembly 62 is preferably oriented substantially vertically relative to a horizontal plane 28. However, the assembly 62 may be oriented at any inclined angle from the horizontal plane 28, so long as the vent 120 in the cavity 110 that the flip-chip assembly 62 sits within is substantially at the upper portion 104 of the cavity 110 and the force of gravity acting on the resin 24 continues to force substantially all of the air or other gases out of the cavity through the vent 120 before any air pockets or other voids form.

Figure 9:
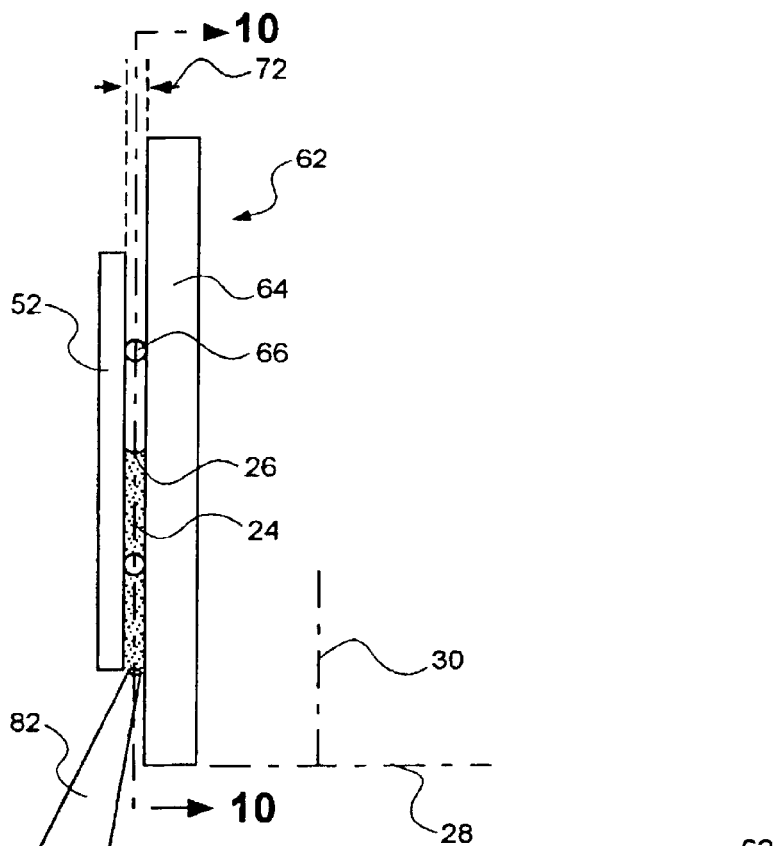
FIG. 9 is a cross-sectional side view of an assembly of a carrier substrate and a semiconductor device flip-chip bonded thereto, illustrating an underfill process between the semiconductor device and substrate in a substantially vertical upward direction, in accordance with the present invention.
Figure 10:
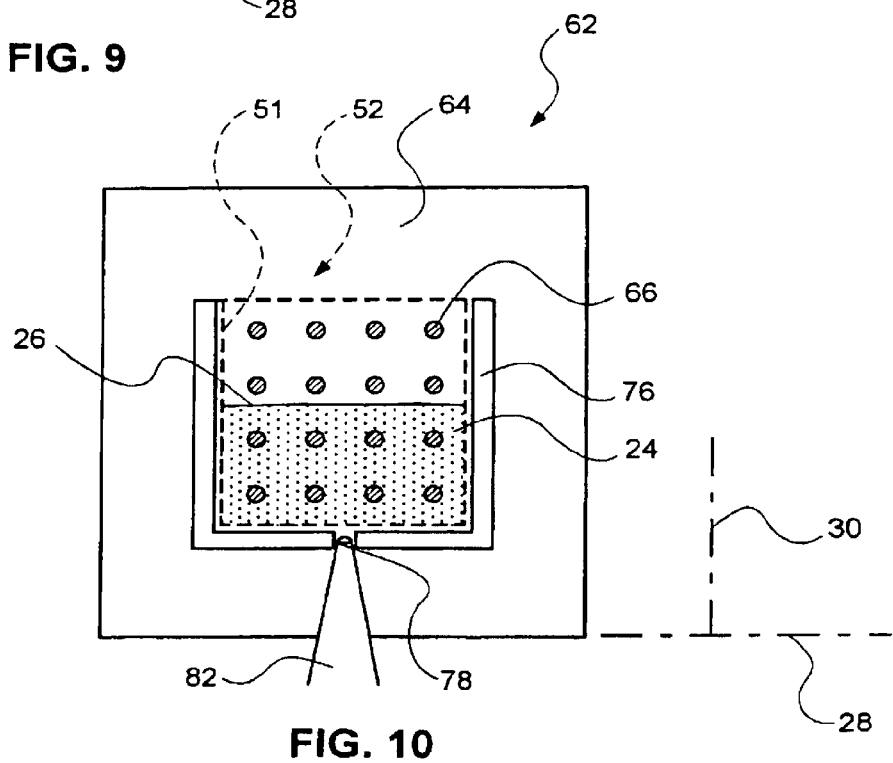
FIG. 10 is a cross-sectional front view taken along line 10—10 of drawing FIG. 9, illustrating the underfill process in the vertically oriented direction, in accordance with the present invention.
Figure 1:
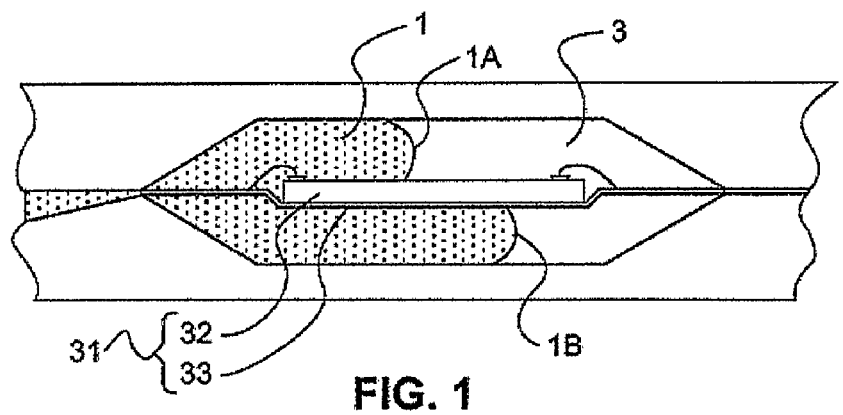
Figure 2:
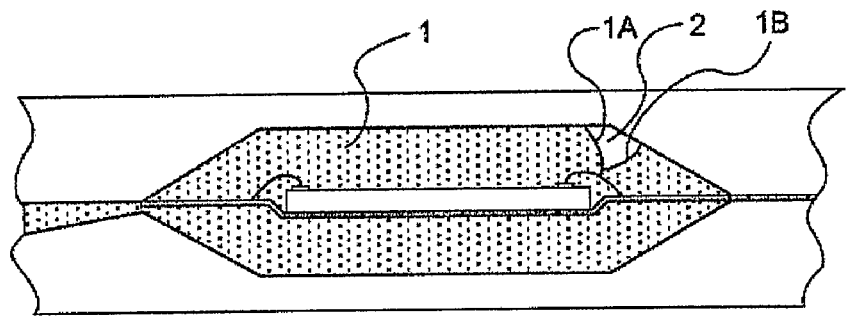
Figure 3:
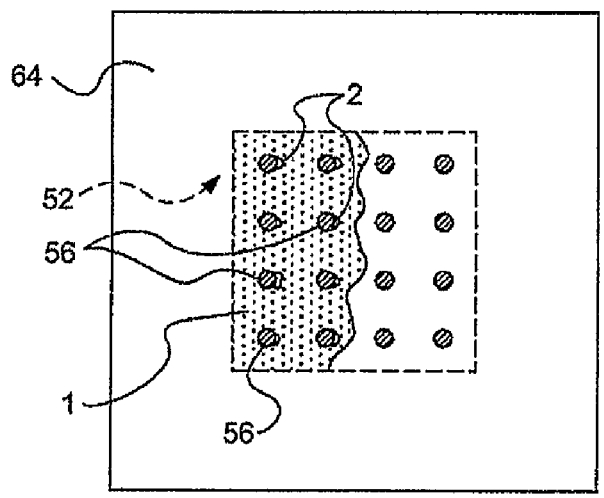

A sixth embodiment is illustrated in drawing FIGS. 9 and 10, depicting resin 24 filling a gap 72 between a semiconductor die 52 and a substrate 64, such as a carrier substrate or an interposer (i.e., a flip-chip assembly 62) in a substantially vertical direction. In the sixth embodiment, at least one barrier 76 is disposed adjacent the periphery 51 of semiconductor die 52 and includes a space or opening 78 formed therein and configured to facilitate dispensing or injecting the resin 24 into a gap 72 between the semiconductor die 52 and the substrate 64. Further, as a dispenser 82 provides resin 24 through opening 78, the resin 24 preferably fills the gap 72 between the substrate 64 and die 52 via capillary action, although positive or negative pressure may be applied to resin 24 as known in the art to accelerate the flow of resin 24 into the gap 72. As such, the at least one barrier 76 is provided to contain the resin in the gap 72 between the semiconductor die 52 and the substrate 64. Accordingly, as in the previous embodiments, it can be well appreciated that gravity provides a more uniform flow front 26, wherein the gravitational force induces the resin 24 to fill in spaces above conductive structures 66 where potential air pockets and/or voids are conventionally formed around the conductive structures 66 in the gap 72 between the substrate 64 and semiconductor die 52.

While the present invention has been disclosed in terms of certain preferred embodiments, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A method of molding a semiconductor assembly comprising:
   providing a transfer mold having an inner surface defining at least one mold cavity;
   providing at least one semiconductor substrate having an active surface with conductive elements thereon and a back surface thereof;
   positioning the at least one semiconductor substrate in the at least one mold cavity of the transfer mold so that portions of the inner surface of the transfer mold abut with the conductive elements of the active surface of the at least one semiconductor substrate;
   orienting the active surface of the at least one semiconductor substrate substantially vertically within the at least one mold cavity;
   configuring the portions of the inner surface of the transfer mold to comprise a plurality of recesses formed therein, each recess of the plurality defined by an imperforate boundary wall sized and configured to at least partially substantially conformally receive a portion of corresponding conductive elements protruding from the at least one semiconductor substrate; and
   introducing a flowable material into the at least one mold cavity so that the flowable material flows around the portions of the inner surface of the transfer mold abutting with the conductive elements on the active surface of the at least one semiconductor substrate.

2. The method according to claim 1, wherein the providing the transfer mold comprises configuring the transfer mold so that the at least one mold cavity is substantially vertically oriented with at least one gate at a lower portion of the transfer mold and at least one vent at an upper portion of the transfer mold.

3. The method according to claim 2, wherein the introducing the flowable material comprises:
   substantially filling the at least one mold cavity in a substantially vertical direction.

4. The method according to claim 3, wherein the substantially filling the at least one mold cavity comprises:
   introducing the flowable material through the at least one gate until a single flow front of the flowable material contacts the at least one vent at the upper portion of the at least one mold cavity.

5. The method according to claim 4, wherein the introducing the flowable material comprises:
   filling the at least one mold cavity until a single flow front of the flowable material contacts the at least one vent.

6. The method according to claim 5, wherein the filling the at least one mold cavity with the flowable material comprises:
   at least partially encapsulating the at least one semiconductor substrate.

7. The method according to claim 3, wherein the introducing the flowable material in the substantially vertical direction comprises:
   inducing a substantially uniform flow front.

8. The method according to claim 1, wherein the introducing the flowable material comprises introducing the flowable material onto the active surface of the at least one semiconductor substrate.

9. The method according to claim 3, wherein the introducing the flowable material in the substantially vertical direction comprises:
   substantially preventing voids in the flowable material.

10. The method according to claim 1, wherein the providing the at least one semiconductor substrate comprises:
    providing an assembly including the at least one semiconductor substrate.

11. The method according to claim 10, wherein the providing the assembly comprises:
    providing the assembly with the at least one semiconductor substrate comprising at least one semiconductor die having the conductive elements in the form of bond pads thereon, the at least one semiconductor die including conductive structures protruding from the bond pads.

12. The method according to claim 1, wherein the providing the at least one semiconductor substrate comprises:
    providing at least one individual semiconductor die.

13. The method according to claim 12, wherein the providing the at least one individual semiconductor die comprises:
    providing the at least one individual semiconductor die with conductive structures protruding therefrom to be received by and abut with the portions of the at least one mold cavity.

14. The method according to claim 1, wherein the providing the at least one semiconductor substrate comprises:
providing a large-scale semiconductor substrate.

15. The method according to claim 14, wherein the providing the large-scale semiconductor substrate comprises:
providing a plurality of semiconductor dice interconnected to each other, each of the plurality comprising the conductive elements in the form of bond pads and conductive structures protruding from the bond pads.

16. The method according to claim 14, wherein the providing the large-scale semiconductor substrate comprises:
providing at least a portion of a wafer.

17. The method according to claim 1, wherein the introducing the flowable material includes capillary action acting on the flowable material.

18. The method according to claim 1, wherein the introducing the flowable material includes positive pressure acting on the flowable material.

19. The method according to claim 1, wherein the introducing the flowable material includes negative pressure acting on the flowable material.

20. The method according to claim 5, wherein the filling the at least one mold cavity with the flowable material comprises substantially completely encapsulating the at least one semiconductor substrate.

21. The method according to claim 1, wherein the providing at least one semiconductor substrate having the active surface with conductive elements thereon comprises providing at least one semiconductor substrate having an active surface with conductive columns or pillars.

22. A method for encapsulating a substrate that substantially prevents voids in an encapsulant, the method comprising:
providing a transfer mold having an inner surface defining at least one mold cavity;
providing at least one semiconductor substrate having an active surface with conductive elements thereon and a back surface thereof;
positioning the at least one semiconductor substrate in the at least one mold cavity of the transfer mold so that portions of the inner surface of the transfer mold abut with the conductive elements of the active surface of the at least one semiconductor substrate;
orienting the active surface of the at least one semiconductor substrate substantially vertically within the at least one mold cavity;
configuring the portions of the inner surface of the transfer mold to comprise a plurality of recesses formed therein, each of the recesses having an imperforate boundary wall sized and configured to at least partially substantially conformally receive a portion of a corresponding conductive element protruding from the at least one semiconductor substrate; and
introducing a flowable material into the at least one mold cavity so that the flowable material flows around the portions of the inner surface of the transfer mold abutting with the conductive elements on the active surface of the at least one semiconductor substrate.

23. The method according to claim 22, wherein the providing the transfer mold comprises configuring the transfer mold so that the at least one mold cavity is non-horizontally oriented with at least one gate at a lower portion of the transfer mold and at least one vent at an upper portion of the transfer mold.

24. The method according to claim 23, wherein the introducing the flowable material comprises:
substantially filling the at least one mold cavity in a non-horizontal direction.

25. The method according to claim 24, wherein the substantially filling the at least one mold cavity comprises:
introducing the flowable material through the at least one gate until a single flow front of the flowable material contacts the at least one vent at the upper portion of the at least one mold cavity.

26. The method according to claim 22, wherein the introducing the flowable material comprises:
filling the at least one mold cavity until the single flow front of the flowable material contacts the at least one vent.

27. The method according to claim 26, wherein the filling the at least one mold cavity with the flowable material comprises:
at least partially encapsulating the at least one semiconductor substrate.

28. The method according to claim 22, wherein the introducing the flowable material comprises:
inducing a substantially uniform flow front.

29. The method according to claim 22, wherein the introducing the flowable material comprises permitting the flowable material to flow onto the active surface of the at least one semiconductor substrate.

30. The method according to claim 22, wherein the introducing the flowable material comprises:
substantially preventing voids in the flowable material.

31. The method according to claim 22, wherein the providing the at least one semiconductor substrate comprises:
providing an assembly including the at least one semiconductor substrate.

32. The method according to claim 31, wherein the providing the assembly comprises:
providing the assembly with the at least one semiconductor substrate including at least one semiconductor die having the conductive elements in the form of bond pads thereon, the at least one semiconductor die including conductive structures protruding from the bond pads.

33. The method according to claim 22, wherein the providing the at least one semiconductor substrate comprises:
providing at least one individual semiconductor die.

34. The method according to claim 22, wherein the providing the at least one semiconductor substrate comprises:
providing a large-scale semiconductor substrate.

35. The method according to claim 34, wherein the providing the large-scale semiconductor substrate comprises:
providing a plurality of semiconductor dice interconnected to each other, each of the plurality comprising at least one of bond pads and conductive structures protruding from the bond pads.

36. The method according to claim 34, wherein the providing the large-scale substrate comprises:
providing at least a portion of a wafer.

37. The method according to claim 22, wherein the introducing the flowable material includes capillary action acting on the flowable material.

38. The method according to claim 22, wherein the introducing the flowable material includes positive pressure oh the flowable material.

39. The method according to claim 22, wherein the introducing the flowable material includes negative pressure on the flowable material.

40. The method according to claim 26, wherein the filling the at least one mold cavity with the flowable material comprises at least partially encapsulating the at least one semiconductor substrate.

41. The method according to claim 22, wherein the providing at least one semiconductor substrate having an active surface with conductive elements thereon comprises providing at least one semiconductor substrate having an active surface with conductive columns or pillars.

* * * * *

UNITED STATES PATENT AND TRADEMARK OFFICE
CERTIFICATE OF CORRECTION

PATENT NO. : 6,838,319 B1
APPLICATION NO. : 09/652503
DATED : January 4, 2005
INVENTOR(S) : Vernon M. Williams It is certified that error appears in the above-identified patent and that said Letters Patent is hereby corrected as shown below:

In the drawings: Delete Drawing Sheet 1 of 7, and substitute therefor the attached sheet.

Figure 1:
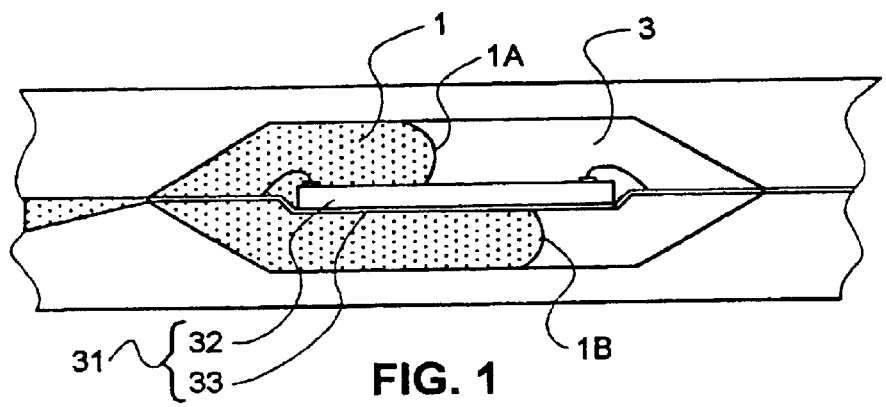
FIG. 1 is cross-sectional side view of a conventional transfer molding process, depicting flowable thermoset resin being transferred into a mold cavity with a semiconductor device therein.
Figure 2:
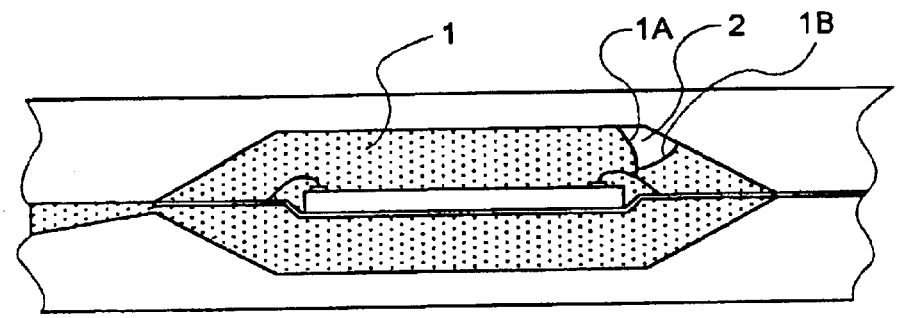
FIG. 2 is a cross-sectional side view of the conventional transfer molding process of FIG. 1, depicting an encapsulated semiconductor device in a mold cavity having a void in the molded resin.
Figure 3:
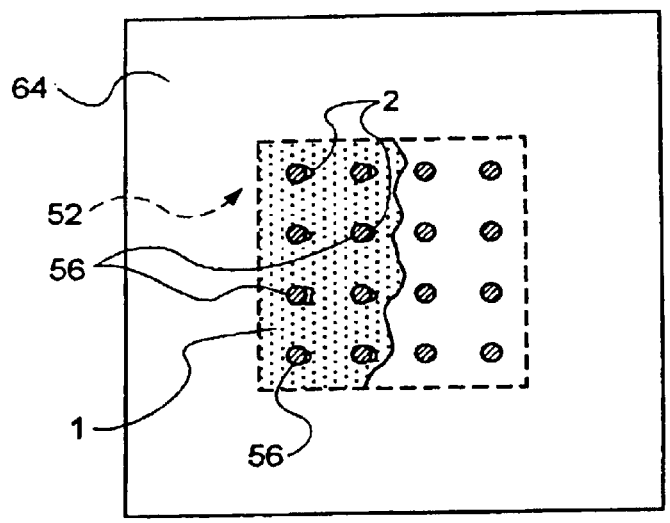
FIG. 3 is a cross-sectional top view of an assembly, including a semiconductor die flip-chip bonded to a carrier substrate, depicting underfill material being dispensed between the semiconductor die and the substrate and voids forming adjacent the solder bumps in a conventional underfill process.

|  |  |
|---|---|
| In FIG. 1, | directly underneath "FIG. 1" insert --(PRIOR ART)-- |
| In FIG. 2, | directly underneath "FIG. 2" insert --(PRIOR ART)-- |
| In FIG. 3, | directly underneath "FIG. 3" insert --(PRIOR ART)-- |

In the specification:

| | | |
|---|---|---|
| COLUMN 6, | LINE 31, | change "surface 45" to --second surface 55-- |
| COLUMN 7, | LINE 32, | change "the resin in" to --the resin 24 in-- |
| COLUMN 7, | LINE 35, | change "flow. front 26, wherein" to --flow front 26, wherein-- |

In the claims:
CLAIM 38, COLUMN 10, LINE 67, change "oh the flowable" to --on the flowable--

Signed and Sealed this

Eighteenth Day of September, 2007

JON W. DUDAS
*Director of the United States Patent and Trademark Office*